United States Patent [19]

Kuboki et al.

[11] Patent Number: 4,617,648

[45] Date of Patent: Oct. 14, 1986

[54] SEMICONDUCTOR INTEGRATED CIRCUIT DEVICE

[75] Inventors: Shigeo Kuboki, Nakaminato; Hideo Maejima; Ikuro Masuda, both of Hitachi, all of Japan

[73] Assignee: Hitachi, Ltd., Tokyo, Japan

[21] Appl. No.: 669,348

[22] Filed: Nov. 8, 1984

[30] Foreign Application Priority Data

Nov. 10, 1983 [JP] Japan ............................ 58/211355

[51] Int. Cl.⁴ ............................................ G11C 13/00
[52] U.S. Cl. .................................. 365/189; 365/154; 365/200
[58] Field of Search ................ 365/154, 73, 75, 78, 365/189, 190, 200, 230, 233

[56] References Cited

U.S. PATENT DOCUMENTS

| | | | |
|---|---|---|---|
| 3,761,695 | 9/1973 | Eichelberger et al. | 235/153 |
| 4,051,352 | 9/1977 | Eichelberger et al. | 364/716 |
| 4,063,080 | 12/1977 | Eichelberger et al. | 235/302 |
| 4,074,851 | 2/1978 | Eichelberger et al. | 235/302 |

Primary Examiner—Terrell W. Fears
Attorney, Agent, or Firm—Antonelli, Terry & Wands

[57] ABSTRACT

A semiconductor integrated circuit device provided with a flip-flop circuit including gates which are connected to each other so as to form a closed loop, is disclosed. The device includes: first means for generating a first write timing signal, a second write timing signal, a diagnosis control signal and diagnostic data which are all concerned with the flip-flop circuit, when the device is diagnosed to detect a fault therein; second means connected to the output side of the flip-flop circuit for making and breaking the closed loop of the gates in accordance with the first write timing signal; third means connected to the output side of the flip-flop circuit for supplying the diagnostic data to the flip-flop circuit in accordance with the second write timing signal; and fourth means connected to the input side of the flip-flop circuit for blocking a signal applied to the input side of the flip-flop circuit, in accordance with the diagnosis control signal.

7 Claims, 13 Drawing Figures

SEMICONDUCTOR INTEGRATED CIRCUIT DEVICE

BACKGROUND OF THE INVENTION

The present invention relates to a semiconductor integrated circuit device, and more particularly to a semiconductor integrated circuit device having a diagnostic function.

A semiconductor integrated circuit device is required to be excellent in mass productivity, and to have high reliability on the basis of a fault detectability approximately equal to 100%. However, in a semiconductor integrated circuit device having as many as thousands of or tens of thousands of gates, it is almost impossible to enhance the fault detectability only by using a test pattern, and it is necessary to provide some diagnostic circuit in the device.

The diagnostic circuit is usually constructed as follows. That is, flip-flops in an integrated circuit have the master-slave structure and are connected to each other so as to form shift registers, external data are successively applied to the flip-flops through a pad, and internal data of the flip-flops are successively read out, to detect the presence or absence of a fault.

Conventional diagnostic circuits of this kind are depicted in FIG. 7 of U.S. Pat. No. 3,761,695, FIGS. 4, 6 and 7 of U.S. Pat. No. 4,051,352, FIG. 7 of U.S. Pat. No. 4,063,080, FIGS. 4 and 7 of U.S. Pat. No. 4,074,851, and an article entitled "A Logic Design Structure for LSI Testability" by E. B. Eicherberger (14th DA Conference, 1977, pages 462 through 468). The prior art shown in these publications will be explained below, with reference to FIG. 1.

Figure 1:
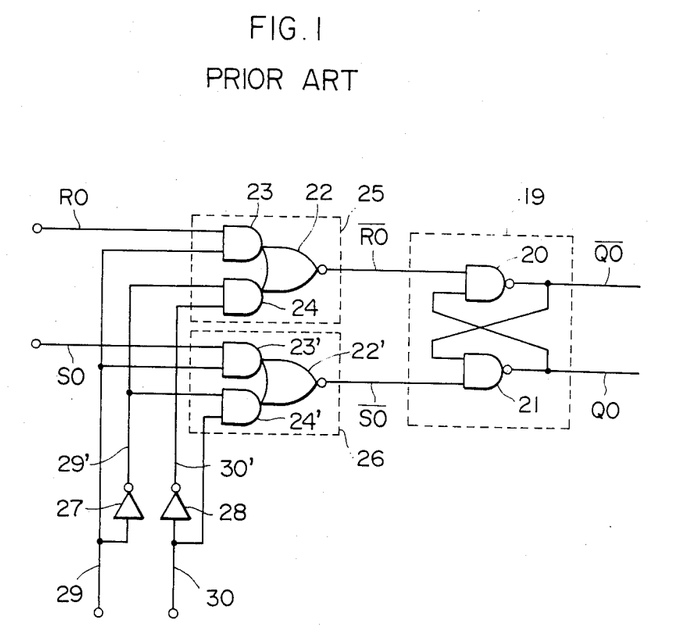
FIGS. 1 and 2 are circuit diagrams showing conventional diagnostic circuits.

FIG. 1 shows a semiconductor integrated circuit device including an RS flip-flop 19. Referring to FIG. 1, the flip-flop 19 is made up of two-input NAND gates 20 and 21, and a diagnostic circuit which includes two-wired, two-input AND/NOR gates 25 and 26, and inverters 27 and 28. The gates 25 and 26 have a set terminal SO, a reset terminal RO for logical operation, a terminal 29 for diagnostic mode signal, a terminal 30 for diagnostic data signal, and terminals 29' and 30' for inverted signals of the signals from the terminals 29 and 30.

When the signal applied to the terminal 29 is at the logical level of "1", the device shown in FIG. 1, performs an ordinary logical operation. On the other hand, when the signal applied to the terminal 29 is at the logical level of "0", the outputs $\overline{RO}$ and $\overline{SO}$ of the gates 25 and 26 take the same logical levels as those of terminals 30 and 30', respectively. Thus, a diagnostic data signal supplied to the terminal 30 is applied to the flip-flop 19. In other words, the gates 25 and 26 operate as a two-input multiplexer, and select one of an ordinary logical input or a diagnostic input in accordance with the logical level at the terminal 29.

In the case where such a flip-flop cell (including the flip-flop 19 and diagnostic circuit) is formed of CMOS gates, the cell requires seven gates in terms of two-input NAND gate (hereinafter the number of gates will be calculated in terms of two-input NAND gate). That is, the number of gates included in the above cell is larger than the number of gates included in the flip-flop 19 by five. As is well known, a two-input NAND CMOS gate is formed of two pairs of PMOS and NMOS transistors having a common gate electrode (that is, four MOS transistors). The number of gates calculated in terms of two-input NAND gate is readily obtained by dividing the number of inputs of the gates by two.

Another example of such a prior art is disclosed in U.S. Pat. application Ser. No. 575,706 (corresponding to Japanese Patent Application Appl. No. 58-16045). This example will be explained below, with reference to FIG. 2.

Figure 2:
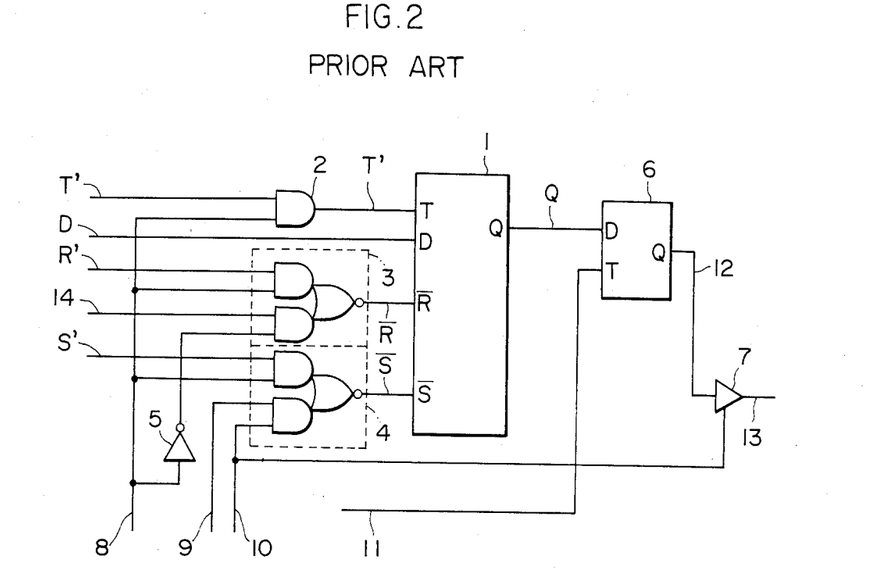

A device shown in FIG. 2 is made up of a D-type flip-flop 1, two-wired two-input AND/NOR gates 3 and 4, an AND gate 2, an inverter 5, a D-type flip-flop 6, and a three-state buffer 7.

Figure 3:
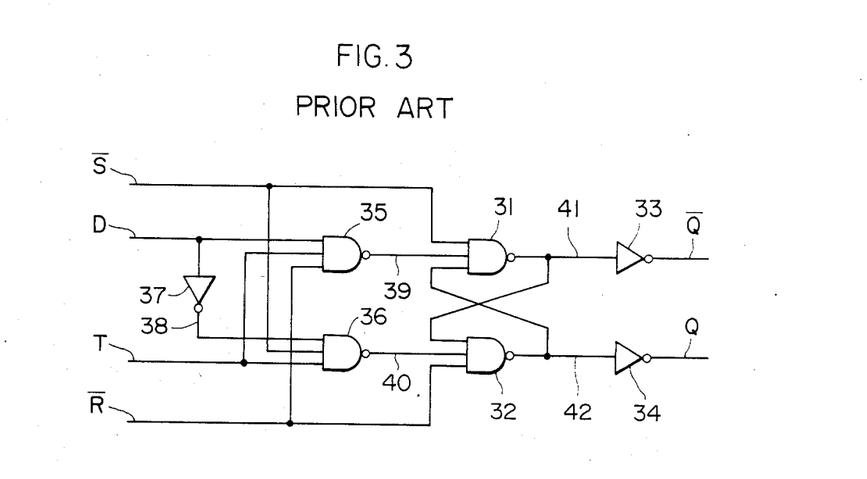
FIG. 3 is a circuit diagram showing part of the diagnostic circuit of FIG. 2 in detail.

The D-type flip-flop 1 has a circuit configuration shown in FIG. 3, and is made up of three-input NAND gates 31 and 32, inverters 33 and 34 for inverting the outputs of the gates 31 and 32, three-input NAND gates 35 and 36 for controlling an input D and an input T, and an inverter 37.

The truth table of the flip-flop 1 is shown in the following table.

TABLE 1

| State | $\overline{S}$ | $\overline{R}$ | D | T | Q | $\overline{Q}$ |
|---|---|---|---|---|---|---|
| 1 | 0 | 0 | — | — | 0 | 0 |
| 2 | 0 | 1 | — | — | 1 | 0 |
| 3 | 1 | 0 | — | — | 0 | 1 |
| 4 | 1 | 1 | — | 0 | $Q_{n-1}$ | $\overline{Q_{n-1}}$ |
| 5 | 1 | 1 | 0 | ⎍ | 0 | 1 |
| 6 | 1 | 1 | 1 | ⎍ | 1 | 0 |

The master-slave type circuit construction, excluding the three-state buffer 7, shown in FIG. 2 permits a loop connection for returning the output of the flip-flop 1 to the input through a combinational circuit, and makes it possible to transfer the output data of combination sections to the flip-flop at one clock timing.

According to the above circuit construction, when an input signal having the logical level of "1" is applied to a terminal 8, an ordinary logical operation is performed. When the terminal 8 is at the logical level of "0", a diagnostic data signal supplied to a terminal 9 is transferred to an input terminal $\overline{S}$ of the flip-flop in synchronism with a strobe pulse signal supplied to a terminal 10. The signal from the terminal 14 for a diagnostic reset signal is inputted to an input terminal $\overline{R}$.

According to the above prior art, the number of gates included in the flip-flop element is equal to 13.5, and is larger than the number of gates included in the flip-flop of FIG. 3 by six. Moreover, as the control operation for diagnostic becomes complicated, the number of gates connected to the input side of the flip-flop is increased. Thus, the response time of the flip-flop element becomes long.

As can be seen from the above, various diagnostic circuits which have hitherto been used, make large the scale of an integrated circuit in a chip, and thus reduce the integration density substantially. Specifically, in a gate array device, the above diagnostic circuits considerably reduce the number of effective circuit elements since a available number of gates in a semiconductor chip is predetermined.

Further, as the diagnostic circuit becomes complicated, the response time of a flip-flop cell becomes long, as explained above.

The term "gate array LSI" means a large scale integrated circuit, on which only a wiring pattern is formed by using masks corresponding to a desired circuit configuration, to produce an integrated circuit having a desired circuit operation. According to such a method, semiconductor wafers in which various processes preceding a wiring process have been completed, are stocked and then used for fabricating various integrated circuit devices. Thus, the fabrication time and cost are greatly reduced.

SUMMARY OF THE INVENTION

It is an object of the present invention to provide a semiconductor integrated circuit device having a simple, small-scale diagnostic circuit.

In order to attain the above object, according to the present invention, there is provided a semiconductor integrated circuit device provided with a flip-flop circuit comprising gates which are connected to each other so as to form a closed loop, which device comprises: first means for generating a first write timing signal, a second write timing signal, a diagnosis control signal and diagnostic data which are all concerned with the flip-flop circuit, when the semiconductor integrated circuit device is tested to detect a fault therein; second means connected to the output side of the flip-flop circuit for making and breaking the closed loop of the gates in accordance with the first write timing signal; third means connected to the output side of the flip-flop circuit for supplying the diagnostic data to the flip-flop circuit in accordance with the second write timing signal; and fourth means connected to the input side of the flip-flop circuit for blocking a signal applied to the input side of the flip-flop circuit, in accordance with the diagnosis control signal.

Other objects and features of the present invention will become more apparent from the following explanation of embodiments.

DESCRIPTION OF THE PREFERRED EMBODIMENTS

Now, embodiments of the present invention will be explained below, with reference to the drawings. In the drawings, like reference numerals designate like circuit elements and signals.

Figure 4A:
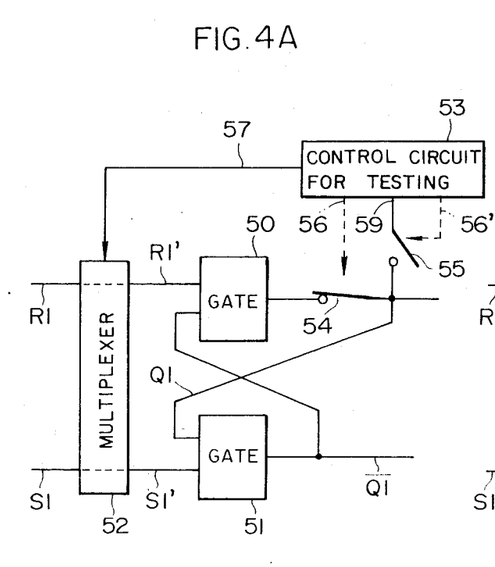
FIGS. 4A and 4B are circuit diagrams for explaining the principle of the present invention.
Figure 4B:
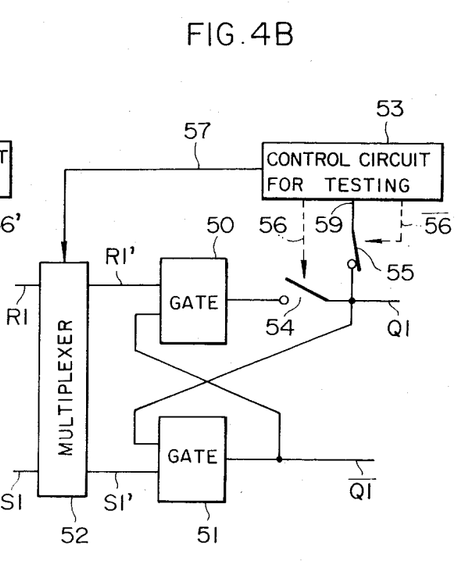

FIGS. 4A and 4B show the principle of the present invention, and indicate an ordinary logical mode operation and a diagnostic mode operation, respectively.

The device shown in FIGS. 4A and 4B includes gates 50 and 51 for forming a flip-flop, a two-channel multiplexer 52, a control circuit for diagnosis (namely, a control circuit for testing) 53, and control switches 54 and 55. Each of the gates 50 and 51 may be a two-input NAND or NOR a two-input gate such as mentioned previously.

In the logical operation mode shown in FIG. 4A, a write timing signal 56 from the control circuit 53 is at the level of "0", to turn on the switch 54. At this time, the switch 55 is at the OFF-state. Further, the multiplexer 52 is put in the active state by a control signal 57 ("1" level). As a result, the device performs an ordinary logical operation on the basis of a set signal S1 and a reset signal R1 which have passed through the multiplexer 52.

While, in a diagnostic data writing period of the diagnostic mode shown in FIG. 4B, the switch 55 is turned on by an output signal $\overline{56}$ ("0" level) from the control circuit 53. At this time, the switch 54 is turned off by the signal 56 ("1" level), and the multiplexer 52 blocks the input signals S1 and R1 on the basis of the signal 57. In this case, outputs R1' and S1' are fixed to a logical level of "Don't care" against the gates 50 and 51.

A diagnostic data signal 59 is sent from an output terminal of the control circuit 53 to the input of the gate 51, through the switch 55. After the logical level of the path has been established, the switch 55 is turned off by the signal $\overline{56}$ ("1" level), and the signal 56 for indicating the write timing is restored to the level of "0". Thus, the switch 54 is turned on and the diagnostic data 59 from the control circuit 53 is held within the flip-flop. At this time, the multiplexer 52 is, of course, kept at the blocking state.

Then, the outputs Q1 and $\overline{Q1}$ of the flip-flop are checked. Partitioning logic structure into the conbinational sections and the flip-flop cells, the above operations are performed for a number of flip-flops, to detect a fault in the device.

As is apparent from FIGS. 4A and 4B, according to the present invention, diagnostic data is applied to the output side of a flip-flop. Such circuit construction can make simple the structure of a diagnostic circuit.

Further, it will be readily understood from the above explanation that the present invention is not limited to a specified flip-flop but is applicable to flip-flops of various types.

Furthermore, it can be readily understood that a read flip-flop for reading out the output of the flip-flop shown in FIGS. 4A and 4B may be connected to the output side of the latter flip-flop.

Figure 5:
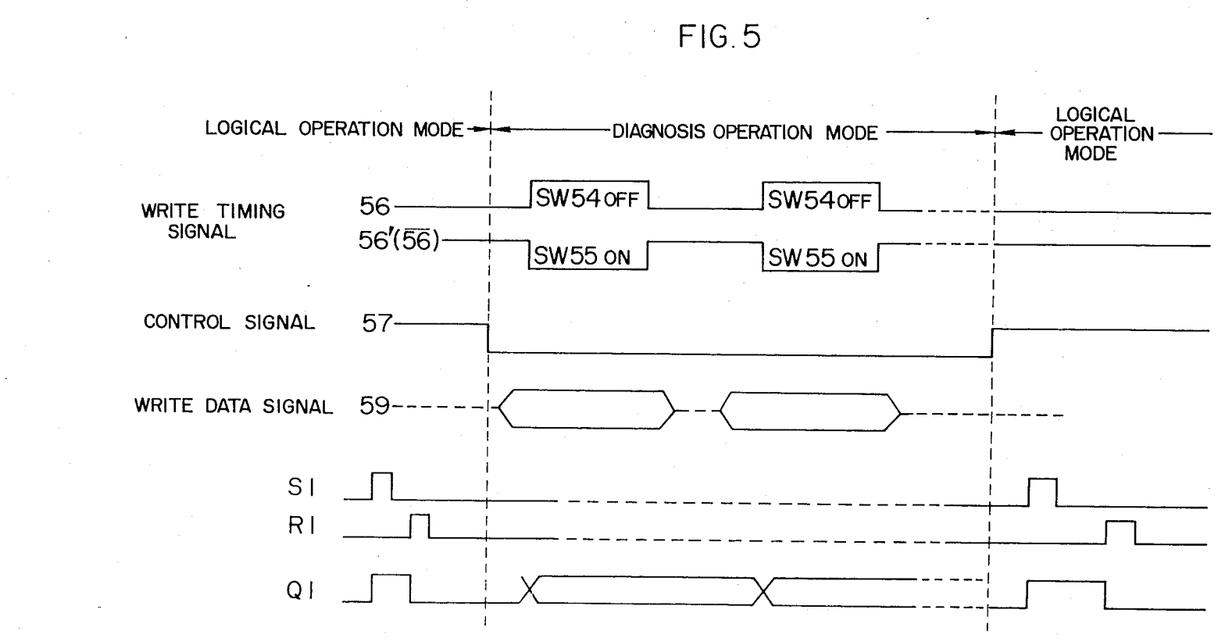
FIG. 5 is the timing chart of the signals shown in FIGS. 4A and 4B.

FIG. 5 is the timing chart of signals shown in FIGS. 4A and 4B. Referring to FIG. 5, in an ordinary logical operation, the signals 56 and 57 take the level of "0" and the level of "1", respectively, and the input signals S1 and R1 perform a set operation and a reset operation, respectively. Further, the switch 55 is put in the OFF-state, and the switch 54 is put in the ON-state.

In a diagnostic data writing period (namely, a scan-in period), just when the signal 56 (namely, the write timing signal) takes the level of "1" and the switch 54 is turned off, the switch 55 is turned on, and the parasitic capacitance with respect to the signal line for the output signal Q1 is charged or discharged in accordance with the voltage level of the diagnostic data signal 59. When the signal 56 is returned to the level of "0", the switch 54 is returned to the ON-state (that is, the ordinary logical operation state), and the diagnostic data is maintained in the loop formed of the gates 50 and 51. Thus, a scan-in operation is completed. Incidentally, the diagnostic data signal 59 is generated in synchronism with the level of "1" of the write timing signal 56 and the level of "0" of the signal 56', which is the inverted signal $\overline{56}$ of the signal 56.

Figure 6:
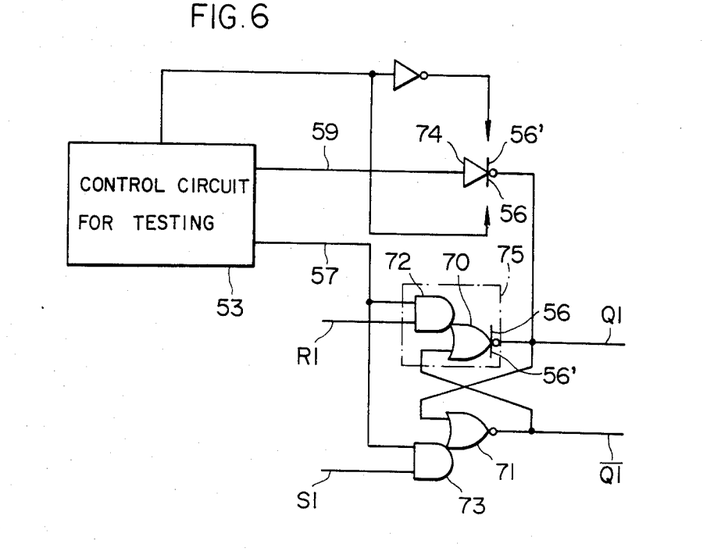
FIG. 6 is a circuit diagram showing a first embodiment of the present invention.

FIG. 6 shows a first embodiment of the present invention. Referring to FIG. 6, a two-input clocked NOR gate 70, a two-input NOR gate 71, and AND gates 72 and 73 make up an RS flip-flop, and a clocked inverter 74 is provided as part of a control circuit for testing. The detailed structures of a clocked AND/NOR gate 75 (including the clocked NOR gate 70 and AND gate 72) and the clocked inverter 74 are shown in FIGS. 7 and 8, respectively.

Figure 7:
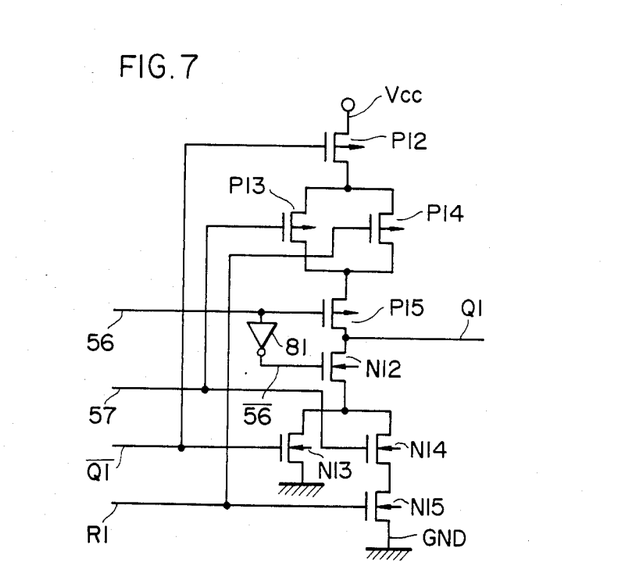
FIGS. 7 and 8 are circuit diagrams showing two circuit parts of the embodiment of FIG. 6 in detail.

Referring to FIG. 7, the clocked AND/NOR gate 75 is made up of, for example, PMOS transistors P12, P13, P14 and P15, NMOS transistors N12, N13, N14 and N15, and an inverter 81. The gate 75 shown in FIG. 7 is the same as a static AND/NOR circuit, except that the transistors P15 and N12 whose gates are applied with the write timing signals 56 and $\overline{56}$, respectively, are additionally provided.

Only when the signal 56 takes the level of "0", the transistors P15 and N12 are put in the ON-state, and the gate 75 can operate as a two AND/NOR gate. When the signal 56 takes the level of "1"transistors P15 and N12 are put in the OFF-state, and the output Q1 is put in a high-impedance state. This state is equivalent to a state that the switch 54 shown in FIGS. 4A and 4B is turned off.

Figure 8:
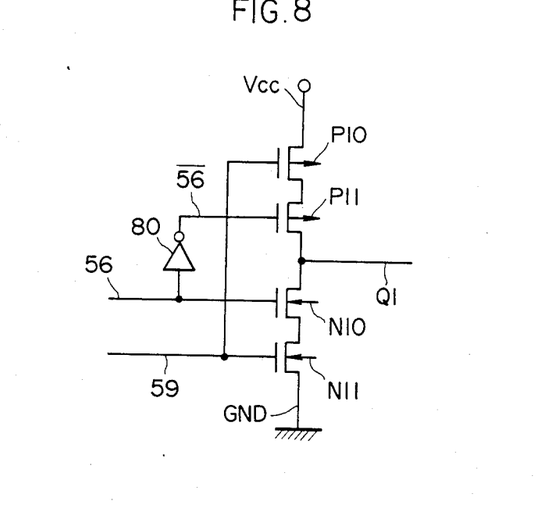

On the other hand, the clocked inverter 74 is made up of PMOS transistors P10 and P11, NMOS transistors N10 and N11, and an inverter 80, as shown in FIG. 8.

When the write timing signals 56 and $\overline{56}$ take the level of "0" and the level of "1", respectively, transistors P11 and N10 are put in the OFF state, and the output Q1 is put in a high-impedance state.

When the signal 56 takes the level of "1", the transistors P11 and N10 are put in the ON-state, and thus the diagnostic data can be delivered as the output Q1. It is to be noted that the inverted data of the input diagnostic data 59 is delivered as the output Q1. That is, the transistors P11 and N10 of the inverter 74 are equivalent to the switch 55 shown in FIGS. 4A and 4B.

The truth table of the above-mentioned RS flip-flop having a diagnostic function is shown in the following table.

When the present embodiment is compared with the circuit construction shown in FIGS. 4A and 4B, the AND gates 72 and 73 shown in FIG. 6 correspond to the multiplexer 52 shown in FIGS. 4A and 4B, the clocked NOR gate 70 corresponds to the gate 50 and switch 54, the two-input NOR gate 71 corresponds to the gate 51, and the clocked inverter 74 corresponds to the switch 55. Accordingly, the present embodiment can perform the same fundamental operation as the circuit shown in FIGS. 4A and 4B.

The flip-flop with the diagnostic function shown in FIG. 6 includes 3.5 gates in terms of two-input NAND gate, and therefore can be made smaller than the flip-flop cell shown in FIG. 1 by about 50%.

Figure 9:
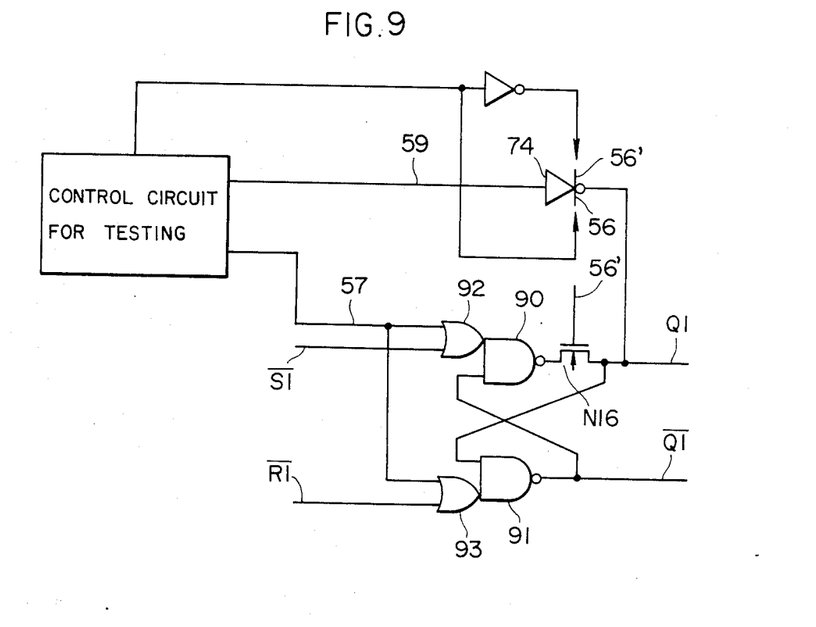
FIG. 9 is a circuit diagram showing a second embodiment of the present invention.

FIG. 9 shows a second embodiment of the present invention, which includes an RS flip-flop.

Referring to FIG. 9, the RS flip-flop is made up of two-input NAND gates 90 and 91, OR gates 92 and 93, and an NMOS transistor N 16. When the present embodiment is compared with the circuit construction shown in FIGS. 4A and 4B, the OR gates 92 and 93 correspond to the multiplexer 52, the two-input NAND gates 90 and 91 correspond to the gates 50 and 51, respectively, the NMOS transistor N 16 corresponds to the switch 54, and the clocked inverter 74 corresponds to the switch 55.

According to the present embodiment, when the mode signal 57 is set to the level of "1" to take the diagnostic mode, a set signal $\overline{S1}$ and a reset signal $\overline{R1}$ are blocked. At the same time as the above operation, the write timing signal $\overline{56}$ takes the leve of "0", to put the transistor N 16 in the OFF-state. Thus, diagnostic data can be written into the flip-flop. CMOS transistor may be used as the switch in place of the NMOS transistor N 16.

The present embodiment is smaller in the number of PMOS transistors than the embodiment shown in FIG. 6, by one. Further, the flip-flop of the present embodiment includes three gates in terms of two-input NAND gate, and therefore can be made smaller than the flip-flop element shown in FIG. 1 by more than 50%.

Figure 10:
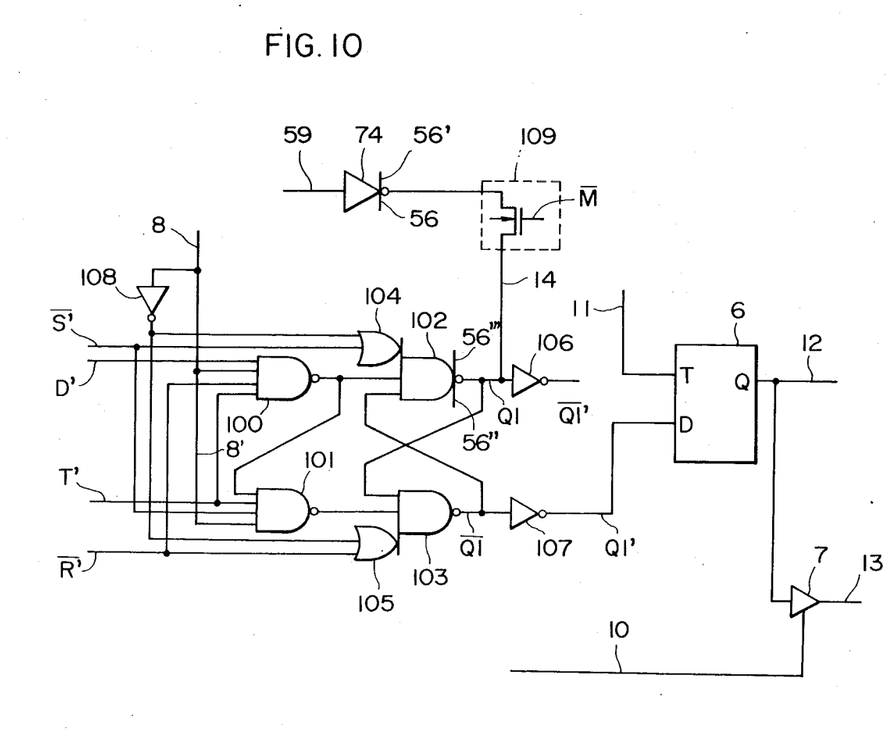
FIG. 10 is a circuit diagram showing a third embodiment of the present invention.

FIG. 10 shows a third embodiment of the present invention, in which a D-type flip-flop provided with set and reset terminals has a diagnostic function.

Referring to FIG. 10, the above flip-flop includes a clocked three-input NAND gate 102, a three-input NAND gate 103, OR gates 104 and 105, four-input NAND gates 100 and 101, and inverters 106, 107 and 108. Further, in order to form a master-slave configuration, another D-type flip-flop 6, a three-state buffer 7 for reading out diagnostic data, and a resistive element 109 peculiar to the present embodiment, are provided.

A diagnostic operation is carried out in the following manner. When the mode signa 8 is set to the level of

TABLE 2

| Mode | signal 57 | signal 56 | signal $\overline{56}$ | R1 | S1 | Q1 | $\overline{Q1}$ | |
|---|---|---|---|---|---|---|---|---|
| Logical mode | 1 | 0 | 1 | 0 | 0 | $Q_{n-1}$ | $\overline{Q_{n-1}}$ | |
| | | | | 1 | 0 | 0 | 1 | |
| | | | | 0 | 1 | 1 | 0 | |
| | | | - | 1 | 1 | 0 | 0 | |
| Diagnostic mode | 0 | 0 | 1 | — | — | $Q_{n-1}$ | $\overline{Q_{n-1}}$ | |
| | | 1 | 0 | — | — | $\overline{\text{signal 59}}$ | signal 59 | Diagnostic data write-in operation |
| | | ⎍⎍ | ⎍⎍ | — | — | $\overline{\text{signal 59}}$ | signal 59 | |

"0", a set signal $\overline{S'}$ and a reset signal $\overline{R'}$ are blocked, since the output of the inverter 108 takes the level of "1" and the outputs of the OR gates 104 and 105 are fixed to the level of "1". Similarly, the outputs of the four-input NAND gates 100 and 101 are fixed to the level of "1" since the input signal 8 applied to the gates 100 and 101 takes the level of "0". Accordingly, signals D' and T' are blocked by the gates 100 and 101. Thus, the diagnostic operation can be performed.

In the ordinary logical operation mode, the mode signal 8 is set to the level of "1". Thus, the signals $\overline{S'}$, D', T' and $\overline{R'}$ are not blocked, and therefore an ordinary logical operation can be performed.

Other functions and operations of the present embodiment are the same as those of the conventional circuit shown in FIG. 2, but the number of gates included in the flip-flop of the present embodiment is smaller than the number of gates included in the flip-flop element shown in FIG. 2, by four.

The resistive element 109 peculiar to the present invention is formed of an NMOS transistor, the gate electrode of which is applied with the inverted signal $\overline{M}$ of a diagnostic mode signal M (namely, the so-called mode signal).

Now, the function of the resistive element 109 will be explained below in detail.

In the ordinary logical operation mode in which the diagnostic mode signal M takes the level of "1", the gate electrode of the NMOS transistor serving as the resistive element 109 takes the level of "0" (namely, an earth potential), and therefore the resistive element 109 is put in the OFF-state. Accordingly, it is prevented by the element 109 to add the output capacitance of the clocked inverter 74 to the input terminal of the inverter 106 through a signal line 14. Thus, the gate delay in the logical operation mode is small.

While, in the diagnostic mode in which the signal M takes the level of "0", the gate electrode of the NMOS transistor serving as the resistive element 109 takes the level of "1" (namely, the so-called $V_{cc}$ potential), and therefore the NMOS transistor is put in the ON-state, that is, operates as a resistor. The function of the resistor is as follows. Even when the clocked inverter 74 is put in the ON-state and diagnostic data are successively sent to the signal line 14, the resistor prevents the diagnostic data from being set in the flip-flop which is connected to the signal line 14 and put in a non-selective state (corresponding to the level of "1" of a signal 56" and the level of "0" of a signal 56"').

That is, in the non-selective state of the flip-flop, the signals 56" and 56"' takes the level of "1" and the level of "0", respectively, and the three-input clocked NAND gate 102 is kept at the ON-state. In the case where the output data Q1 is opposite in binary logical level to the data successively outputted from the clocked inverter 74, a D.C. current path is formed between a power supply $V_{cc}$ and the earth through PMOS and NMOS transistors. Thus, the potential of the signal line 14 fluctuates, and the data Q1 stored in the flip-flop may be inverted.

In order to solve this problem, the resistive element 109 is connected between the clocked inverter 74 and the output terminal of the clocked three-input NAND gate 102 in the flip-flop not selected to make sufficiently large the resistance on the output side of the clocked inverter 74 viewed from the signal line 14, thereby preventing the output Q1 of the NAND gate 102 from being changed by the output data of the clocked inverter 74. If the write timing signal 56 is formed by the logical equation (56)=$\overline{M}$·ADR, where ADR is an address signal of the flip-flops, the resistive element 109 is not always necessary.

Figure 12:
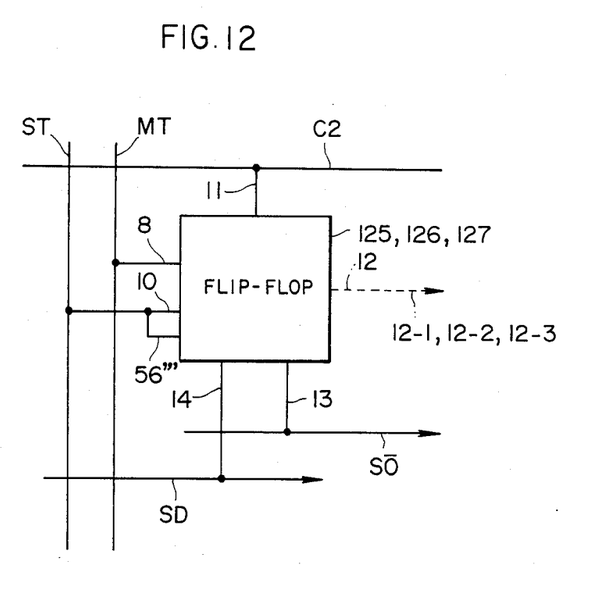
FIG. 12 is a wiring diagram showing the relationship between the signals shown in FIG. 10 and the circuit diagram shown in FIG. 11.

In the present embodiment, decoding lines for selecting one of flip-flops included in an LSI chip, include only four signal lines, namely the mode signal 8, the write timing signal 56" (or 56"'), a slave latch signal 11, and a scan-out signal 10 (these signal lines will be designated by reference numerals 8, 56"', 11 and 10 in FIG. 12). As will be shown in the next embodiment of the present invention, the scan-out signal 10 and write timing signal 56" may be sent by the same signal line. Accordingly, only three signal lines are required. This is because the write-in (or scan-in) operation of diagnostic data and the read-out (or scan-out) operation thereof are performed when the slave latch signal 11 takes the level of "0", and moreover are not performed at the same time.

Figure 11:
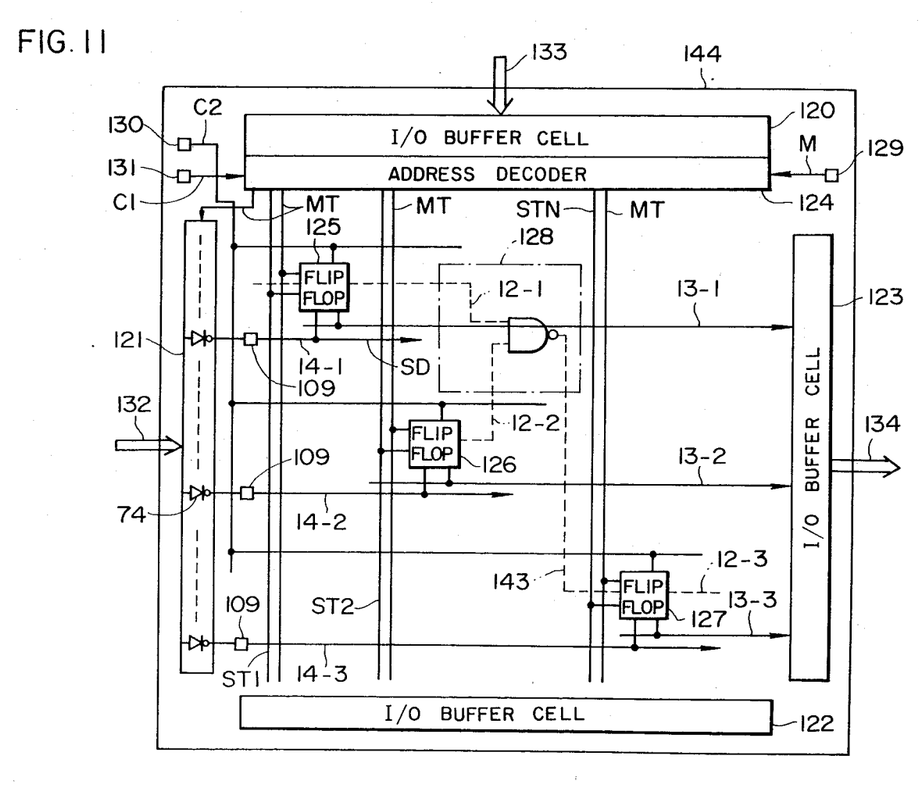
FIG. 11 is a circuit diagram showing a fourth embodiment of the present invention.

FIG. 11 shows a further embodiment of the present invention, which is a gate array including a number of flip-flops each shown in FIG. 10.

Referring to FIG. 11, an LST chip 144 has input/output buffer cells 120 to 123, an address decoder 124, flip-flop cells 125 to 127, and a combinational circuit 128. Each of the flip-flop cells 125 to 127 has the structure shown in FIG. 10. The chip 144 is further provided with an input pad 129 receiving the diagnostic mode signal M, an input pad 130 receiving a second clock signal C2 which indicates the second diagnostic phase, and an input pad 131 receiving a first clock signal C1 which indicates the first diagnostic phase.

The input/output buffer cell 121 is made up of a group of clocked inverters 74, and sends scan-in data to output lines 14-1, 14-2 and 14-3 through resistive elements 109.

Of all flip-flop cells and combinational circuits on the chip 144, only three flip-flop cells and one combinational circuit connected among these flip-flop cells are depicted in FIG. 11, for convenience' sake. Accordingly, it is to be noted that a large number of flip-flop cells similar to the flip-flop cells 125 to 127 are actually arranged. According to the circuit configuration shown in FIG. 11, desired diagnostic data is set in the flip-flop cells 125 and 126, and the output of the flip-flop cell 127 applied with the output of the combinational circuit 128 is read out to an external pin. Thus, the combinational circuit 128 can be diagnosed. That is, in the present embodiment, test data can be set (or scanned in) in desired flip-flop cells on the chip 144, and the state of the flip-flop cells can be directly read out (or scanned out).

FIG. 12 shows the relationship of the signal lines of the flip-flops shown in FIG. 10 to the terminals of the flip-flops 125, 126 and 127.

Referring to FIG. 12, an output signal MT of the address decoder 124 is applied to the signal line 8, a selection/scan-out signal ST is applied to the signal lines 10 and 56"', and the second clock signal C2 is applied to the signal line 11. Further, scan-in data SD is supplied to the signal line 14, and scan-out data SO is delivered from a signal line 13. The signals and data MT, ST and SD are expressed by the following equations:

$$MT = M \cdot C1$$

$$ST = \overline{M} \cdot Ai \cdot C1$$

$$SD = Di \cdot C1$$

where Ai indicates an address output from the address decoder 124, Di scan-in data to the i-th flip-flop cell, M the diagnostic mode signal taking the level of "0" and the level of "1" for the diagnostic mode and logical operation mode, respectively, and C1 the first clock signal indicating the first diagnostic phase. Incidentally, C2 indicates the second clock signal indicating the second diagnostic phase or the slave latch timing.

As is evident from the above equations, each of the signals and data MT, ST and SD is synchronized with the first clock signal C1. The signal MT selects one of the diagnostic mode and logical operation mode, and the signal ST is the selection signal for indicating that a flip-flop cell is accessed in a diagnostic operation. Since the signal ST is applied to the signal line 10 as well as the signal line 56''', the signal ST acts as both the scan-out signal and scan-in signal. Accordingly, at a time when the signal MT takes the level of "0" and the signal ST takes the level of "1", data on the signal line 14 is set in the master flip-flop of a corresponding flip-flop cell. At the same time as this operation, the output of the slave flip-flop 6 is scanned out to the signal line 13. Then, at a time when the second clock signal C2 takes the level of "1", the output Q1 of the master flip-flop is set in the slave flip-flop 6. Next, the output of the flip-flop 6 is scanned out as described above.

It is believed that the operation of the embodiment shown in FIG. 11 has been clarified by the above explanation. The truth table at each of the logical operation mode and diagnostic mode is shown in the following table:

Next, the diagnostic mode is temporarily changed over to the logical mode, and output data from combinational circuits such as the combinational circuit 128 are set in the master flip-flops of a flip-flop cell group at the next stage such as the flip-flop cell 127 (step N2). Further, in step N3, the diagnostic mode is restored, and output data from the above master flip-flops are set in corresponding slave flip-flops at a time when the second clock signal C2 takes the level of "1". In step N4, data in the slave flip-flops are scanned out at a time when the first clock signal C1 takes the level of "1". Thereafter, the above operations are repeated. Though the scan-out is one step N4 in the embodiment, the actual circuit consists of a number of steps of the scan-out likewise the scan-in.

Referring back to FIG. 11, scan-in data from a but 132 is transferred to the signal lines 14-1, 14-2 and 14-3 through the input/output buffer cell line 121 and resistive elements 109. At the same time as the above operation, one of the signals ST-1, ST-2, ... and ST-N takes the level of "1" on the basis of the address signal from an address bus 133, to carry out a scan-in operation. In a scan-out operation, data in the slave flip-flops of a selected flip-flop cell group are delivered to the signal lines 13-1, 13-2 and 13-3 in synchronism with the signal ST, and then sent to an output bus 134 through the input/output buffer cell line 123. The failure of flip-flop cells themselves can be detected by setting data in the flip-flop cells, and transmitting the data to the slave

TABLE 3

| Mode | Step No. | Signal | | | | | |
| --- | --- | --- | --- | --- | --- | --- | --- |
| | | Diagnostic mode signal M | First clock signal C1 | Second clock signal C2 | Scan address | Scan-in data | Scan-out |
| Ordinary mode | | 1 | 1 | 1 | X | X | — |
| Diagnostic mode | | | | | | | |
| Scan-in | 1 | 0 | ⊓ | 0 | 0/1 | 0/1 | 0/1 |
| | 2 | 0 | ⊓ | 0 | 0/1 | 0/1 | : |
| | 3 | : | : | : | : | : | : |
| | : | : | : | : | : | : | : |
| | N | : | ⊓ | 0 | 0/1 | 0/1 | : |
| | N0 | 0 | ⊓ | ⊓ | 0/1 | 0/1 | : |
| | N1 | 0 | ⊓ | 0 | 0/1 | 0/1 | 0/1 |
| FF in | N2 | 1 | ⊓ | 0 | X | X | — |
| Scan-out | N3 | 0 | 0 | ⊓ | 0/1 | X | — |
| | N4 | 0 | ⊓ | 0 | 0/1 | X | 0/1 |

As is apparent from the table 3, at the scan-in operation in the diagnostic mode, a diagnostic pattern is set in desired master flip-flops in steps 1 through N. The second clock signal C2 is kept at the level of "0" in steps 1 through N. In step N0 which is the second step from the final step N1 of the scan-in operation, the second clock signal C2 is put in the level of "1", to set the outputs Q1 of the master flip-flops in slave flip-flops such as the flip-flop 6.

flip-flops (at the timing when C2 = "1"), and by directly scanning out the data in the flip-flop cells.

When the signals shown in FIGS. 4A and 4B are compared with the signals shown in FIG. 12, the output signal MT of the address decoder 124 which is expressed by the logical formula M·C1 and is the mode signal or an input signal of the four-input NAND gates 100 and 101, corresponds to the control signal 57 shown in FIGS. 4A and 4B, the selection/scan-out signal ST corresponds to the selection signal 56 (namely, 56, 56'" and 10), and the scan-in data SD (on the signal line 14) corresponds to the signal Q1. The scan-out data $\overline{SO}$ (on the signal line 13) and second clock signal C2 (on the signal line 11) which are shown in FIG. 12, are concerned with the slave flip-flop for diagnostic use, and any signals corresponding to $\overline{SO}$ and C2 are not shown in FIGS. 4A and 4B.

As has been explained in the foregoing, according to the present invention, a semiconductor integrated circuit device including flip-flops and having a diagnostic function, can be made smaller in size than a conventional one by 30 to 50%.

Further, since the device including diagnostic circuit according to the present invention is simple in the structure, the response time of the device is scarcely increased by the presence of the diagnostic circuit.

Furthermore, the semiconductor device according to the present invention is high in fault detectability, excellent in reliability, and low in fabrication cost, and moreover can be formed from a gate array, with high integration density.

What is claimed is:

1. A semiconductor integrated circuit device provided with a flip-flop circuit including gates which are connected to each other so as to form a closed loop, said device comprising:

first means for generating a first write timing signal, a second write timing signal, a diagnosis control signal and diagnostic data which are all concerned with said flip-flop circuit, when said semiconductor integrated circuit device is diagnosed to detect a fault therein;

second means connected to the output side of said flip-flop circuit for making and breaking the closed loop of said gates in accordance with said first write timing signal;

third means connected to the output side of said flip-flop circuit for supplying said diagnostic data to said flip-flop circuit in accordance with the second write timing signal; and fourth means connected to the input side of said flip-flop circuit for blocking a signal applied to the input side of said flip-flop circuit, in accordance with said diagnosis control signal.

2. A semiconductor integrated circuit device according to claim 1, wherein said second means includes a clocked NOR gate, said third means includes a clocked inverter, and said fourth means includes an AND gate.

3. A semiconductor integrated circuit device according to claim 1, wherein said second means includes an NMOS transistor, said third means includes a clocked inverter, and said fourth means includes an OR gate.

4. A semiconductor integrated circuit device according to claim 1, wherein said second means includes a clocked NAND gate, said third means includes a clocked inverter, and said fourth means includes an NAND gate and an OR gate.

5. A semiconductor integrated circuit device according to claim 4, wherein said third means further includes a variable-resistance element.

6. A semiconductor integrated circuit device according to claim 1, wherein said flip-flop circuit further includes a combinational circuit.

7. A semiconductor integrated circuit device according to claim 1, further comprising a read flip-flop circuit connected to the output side of said flip-flop circuit for holding and reading out the output of said flip-flop circuit.

* * * * *